(12) United States Patent
Yun et al.

(10) Patent No.: US 7,253,060 B2
(45) Date of Patent: Aug. 7, 2007

(54) GATE-ALL-AROUND TYPE OF SEMICONDUCTOR DEVICE AND METHOD OF FABRICATING THE SAME

(75) Inventors: Eun-jung Yun, Yongin-si (KR); Sung-min Kim, Metropolitan (KR); Sung-young Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 288 days.

(21) Appl. No.: 11/074,711

(22) Filed: Mar. 9, 2005

(65) Prior Publication Data

US 2005/0272231 A1 Dec. 8, 2005

(30) Foreign Application Priority Data

Jun. 8, 2004 (KR) .................. 10-2004-0041857

(51) Int. Cl.
*H01L 21/336* (2006.01)
*H01L 21/3205* (2006.01)
*H01L 21/4763* (2006.01)

(52) U.S. Cl. .................. 438/284; 438/286; 438/283; 438/282; 438/287; 438/587; 438/157; 257/E21.618; 257/E21.634; 257/E21.429; 257/E21.43

(58) Field of Classification Search ............... 438/284, 438/286, 283, 282, 587, 157; 257/E21.618, 257/E21.634, E21.429, E21.43
See application file for complete search history.

(56) References Cited

U.S. PATENT DOCUMENTS

| 5,578,513 | A | * | 11/1996 | Maegawa | 438/151 |
| 5,879,998 | A | * | 3/1999 | Krivokapic | 438/300 |
| 6,495,403 | B1 | | 12/2002 | Skotnicki et al. | |
| 6,900,102 | B2 | * | 5/2005 | Lee et al. | 438/282 |
| 2003/0189227 | A1 | | 10/2003 | Liu et al. | |
| 2004/0152272 | A1 | * | 8/2004 | Fladre et al. | 438/284 |
| 2005/0266645 | A1 | * | 12/2005 | Park | 438/282 |
| 2005/0272231 | A1 | * | 12/2005 | Yun et al. | 438/585 |
| 2006/0216897 | A1 | * | 9/2006 | Lee et al. | 438/282 |

FOREIGN PATENT DOCUMENTS

| JP | 11-068069 | 3/1999 |
| KR | 1020020078996 A | 10/2002 |

* cited by examiner

*Primary Examiner*—Walter Lindsay, Jr.
(74) *Attorney, Agent, or Firm*—Volentine & Whitt, PLLC

(57) ABSTRACT

A gate-all-around (GAA) transistor device has a pair of pillars that include the source/drain regions, a channel region bridging the source/drain regions, and a gate electrode and gate oxide which surround the channel region. The pillars are formed by providing a mono-crystalline silicon substrate, etching the substrate to form a pair of spaced-apart trenches such that a wall of the mono-crystalline silicon stands between the trenches, filling the trenches with insulative material, implanting impurities into the wall of mono-crystalline silicon, and forming an opening in the wall such that portions of the wall remain as pillars. A sacrificial layer is formed at the bottom of the opening. Then, the channel region is formed atop the sacrificial layer between the pillars. The sacrificial layer is subsequently removed and the gate oxide and gate electrode are formed around the channel region. One or more sidewall spacers are used to establish the effective width of the channel region and/or minimize parasitic capacitance between the source/drain regions and gate electrode.

25 Claims, 26 Drawing Sheets

GATE-ALL-AROUND TYPE OF SEMICONDUCTOR DEVICE AND METHOD OF FABRICATING THE SAME

BACKGROUND OF THE INVENTION

1. Field of the Invention

The present invention generally relates to semiconductor devices, and more particularly, the present invention relates semiconductor devices having gate-all-around (GAA) structures, and to methods of fabricating the semiconductor devices having gate-all-around (GAA) structures.

2. Description of the Related Art

Semiconductor devices having GAA structures are in particular demand because of their excellent performance and due to their suppression of the short-channel effect. These advantages are incurred because a thin silicon layer that forms the channel of a GAA semiconductor device is surrounded by a gate and exclusively controlled thereby. Hence, the electric field generated at the drain has little influence on the channel region, i.e., a short-channel effect is suppressed.

A three-dimensional transistor having a GAA structure generally uses a silicon on insulator (SOI) wafer. However, the use of an SOI wafer to manufacture a semiconductor device having a GAA type transistor presents fabrication challenges, such as the high initial cost associated with producing the SOI wafer, and the creation of a floating body effect.

SUMMARY OF THE INVENTION

An object of the present invention is to provide a cost-efficient method of manufacturing a GAA type of semiconductor device.

Another object of the present invention is to provide a GAA type of semiconductor device that does not exhibit a floating body effect.

Another object of the present invention is to provide a method of manufacturing a GAA type of semiconductor device which does not undesirably alter the effective channel length of the device.

Another object of the present invention is to provide a GAA type of semiconductor device that exhibits minimal parasitic capacitance between the source/drain region(s) and the gate.

According to one aspect of the present invention, a GAA type of transistor is manufactured using a bulk silicon wafer and, in particular, a mono-crystalline silicon wafer, as opposed to an SOI wafer.

According to still another aspect of the present invention, the source/drain regions are formed using a blanket ion implantation technique as opposed to LDD ion implantation.

In this regard, a method of manufacturing a GAA type of semiconductor device according to the present invention includes providing a substrate, such as a mono-crystalline silicon substrate, etching the substrate to form a pair of spaced-apart trenches such that a wall of the silicon stands between the trenches, filling the trenches with insulative material, and ion-implanting impurities into the wall of silicon. Subsequently, an opening is formed in the wall to separate portions of the wall, whereby pillars having the source and drain regions of the device are formed. Then, a channel region is formed in the opening as bridging the source and drain regions. Finally, a gate oxide and gate electrode are formed around the channel region.

According to yet another aspect of the present invention, sidewall spacers are used to provide insulative material at one or more sides of the gate electrode.

In this regard, a method of manufacturing a GAA type of semiconductor device according to the present invention includes providing a substrate having an active region in the form of a strip extending lengthwise in a first direction between first and second isolation regions, forming an opening in the active region between the first and second isolation regions, and forming first sidewall spacers within the opening on opposing sidewalls of the active region. Subsequently, a sacrificial layer is formed at the bottom of the opening. At least a portion of the first sidewall spacers is removed to expose the opposing sidewalls of the active region. Then, a channel region is formed between the exposed portions of the opposing sidewalls of the active region and over the sacrificial layer. Next, the sacrificial layer is removed, and a gate insulating layer and a gate electrode are formed around the channel region.

In one embodiment, the sacrificial layer is formed between the first sidewall spacers at the bottom of the opening. In this case, the first sidewall spacers are etched using the sacrificial layer as an etch mask such that residual portions of the spacers are left on opposite sides of the sacrificial layer. The channel region is then formed on the sacrificial layer and residual portions of the first sidewall spacers.

Accordingly, a GAA type of semiconductor device according to the present invention includes a first pillar comprising a source region, a second pillar comprising a drain region and spaced from the first pillar, a channel region bridging the source and drain regions, a gate insulating layer and a gate electrode which surround the channel region, and insulative material located laterally of the gate electrode below the channel region.

In another embodiment, the substrate is etched to form a recess therein using the first sidewall spacers as an etch mask. Then, the first sidewall spacers are removed. The sacrificial layer is formed in the recess. The channel region is formed across the sacrificial layer.

Accordingly, another embodiment of a GAA type of semiconductor device according to the present invention includes a first pillar comprising a source region, a second pillar comprising a drain region and spaced from the first pillar, a channel region bridging the source and drain regions, and a gate insulating layer and a gate electrode which surround the channel region such that the gate electrode has a lower portion disposed below the channel region. Accordingly, the width of the channel region from the source region to the drain region is greater than the width of the lower portion of the gate electrode as measured in the same direction between the source and drain regions.

In either embodiment, mask patterns are formed across the active region as spaced apart from one another the longitudinal direction of the active region. The opening in the active region is formed by etching the substrate using the mask patterns as an etch mask. Also, second sidewall spacers are formed on the opposing sidewalls of the mask patterns and across the channel region prior to forming the gate oxide layer and gate electrode. The insulative material, provided by the residual portions of the first sidewall spacers and/or the second sidewall spacers, minimizes parasitic capacitance.

Preferably, the sacrificial layer is formed of an SiGe epitaxial layer. The channel region can thus be formed of an Si epitaxial layer. The channel region may have an upper surface that is at the same level as the upper surfaces of the pillars that comprise the source/drain regions. Alternatively, the channel region may have an elevated structure in which the upper surface thereof is situated at a level above the upper surfaces of the pillars. As another alternative, the channel region may have a recessed structure in which the upper surface thereof is situated at a level below the upper surfaces of the pillars. Also, the channel region may completely overlap the source/drain regions at respective ends of the channel region.

According to yet another aspect of the present invention, the substrate is counter-doped below the gate electrode. The counter-doping may be performed using an ion implantation or plasma doping technique. Preferably, the impurities of the counter-doped region are B, $BF_2$, $BF_3$ or In ions. The counter-doping may be performed in the region of the substrate exposed at the bottom of the opening in the active region before the first sidewall spacers are formed. Alternatively, the counter-doping may be performed in the region of the substrate exposed at the bottom of the opening in the active region after the first sidewall spacers are formed and before the sacrificial layer is formed.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

Figure 1A:
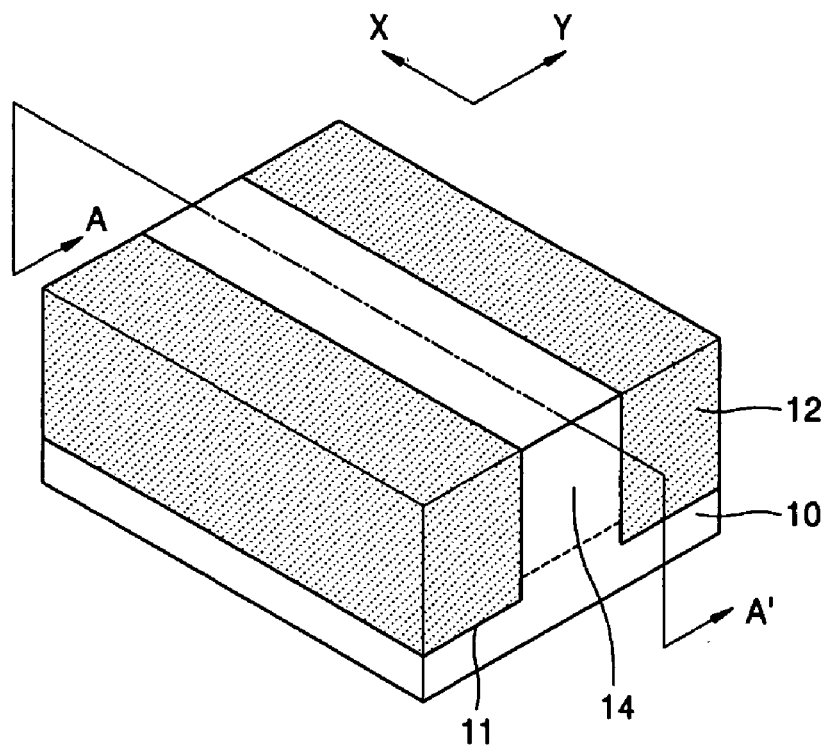
FIGS. 1A, 2A, 3A, 4A, 5A, 6A, 7A, 8A, 9A and 10A are perspective views of a GAA type of semiconductor device during the course of its manufacture, illustrating a first embodiment of a method of manufacturing a GAA type of semiconductor device according to embodiments of the present invention.
Figure 1B:
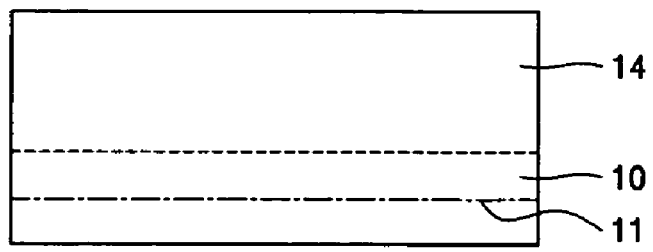
FIG. 1B is a sectional view taken along line A–A' of FIG. 1A.

The present invention will now be described more fully with reference to the accompanying drawings. In the drawings, the thicknesses of layers and regions are exaggerated for clarity. Also, like reference numerals designate like elements throughout the drawings.

FIGS. 1A through 10B illustrate a method of manufacturing a gate-all-around (GAA) semiconductor device according to the present invention. Referring first to FIGS. 1A and 1B, a wall is formed from a mono-crystalline silicon semiconductor substrate 10. The wall has a predetermined height as measured from a first lower surface 11 and extends longitudinally in a first direction (e.g., direction X in FIG. 1A). In general, the substrate 10 is etched to form trenches therein, and a layer of insulative material is formed within the trenches to thereby provide a plurality of isolation structures 12. The isolation structures 12 extend in the first direction such that the part of the semiconductor substrate 10 between the isolation structures 12 forms the aforementioned wall. The first lower surface 11 thus corresponds to the bottom of the trenches, i.e., the area to which the substrate 10 is etched.

The trench isolation technique of forming the isolation structures 12 around a portion of the semiconductor substrate 10 will now be described in even more detail. First, a pad oxide layer (not shown) and a nitride layer (not shown) are formed on the surface of the semiconductor substrate 10. Then, a photoresist layer (not shown) is formed on the nitride layer, and the photoresist layer is patterned using photolithography. The pad oxide layer and the nitride layer are then etched using the patterned photoresist layer as a mask to thereby, in turn, form a mask pattern. Trenches are formed in the semiconductor substrate 10 by anisotropically dry-etching the semiconductor substrate 10 to a predetermined depth using the mask pattern as an etching mask.

Then, a layer of insulative material is formed on the substrate 10 to such a thickness that the trenches are filled. Also, the mask pattern is removed and the structure is planarized. Accordingly, as illustrated in FIG. 1A, the planarized layer of insulative material is left in the trenches to form the isolation structures 12 along both sides of the wall of the semiconductor substrate 10.

The isolation structures 12 may be formed from any appropriate layer of insulative material, such as an oxide layer or a nitride layer. In the present embodiment, the isolation structures 12 are formed from a high-density plasma (HDP) oxide film. In any case, the material of the isolation structures 12 is based on providing an etch selectivity, with respect to neighboring materials, in an etching process to be described in further detail later on.

Next, impurities, such as As, are ion-implanted into the wall of the semiconductor substrate 10. Then, the resultant structure is thermally treated to stabilize the ion-implanted region. Accordingly, a first ion-implanted area 14 is formed. The first ion-implanted area 14 will eventually form source/drain regions at the surface of the semiconductor substrate 10.

Figure 2A:
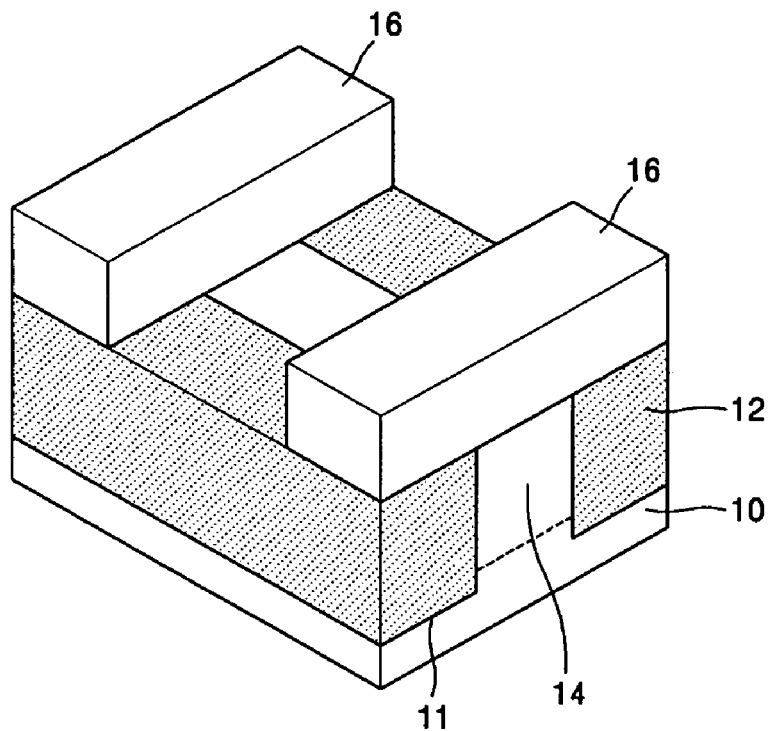
Figure 2B:
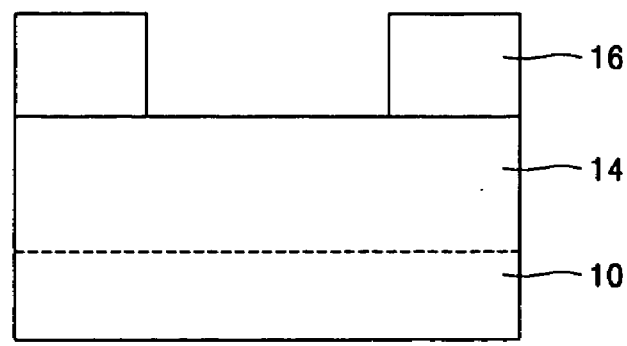
FIGS. 2B, 3B, 4B. 5B, 6B, 7B, 8B, 9B and 10B are similar sectional views of the device shown in FIGS. 2A, 3A, 4A, 5A, 6A, 7A, 8A, 9A and 10A, respectively.

Referring to FIGS. 2A and 2B, a layer of insulative material is formed over the entire surface of the semiconductor substrate 10 after the isolation structures 12 and the wall of the semiconductor substrate 10 defined by the isolation structures 12 are formed. Next, the layer of insulative material is patterned using photolithography to thereby form insulative mask patterns 16 extending in a second direction (e.g., direction Y in FIG. 1A) perpendicular to the direction in which the wall of the semiconductor substrate 10 extends. In the present embodiment, the insulative mask patterns 16 are formed of SiN. However, the insulative mask patterns 16 can be formed of other materials that will provide a desired etch selectivity in a subsequent etching process. Also, the insulative mask patterns 16 will be used in the forming of a gate electrode using a damascene technique. In this respect, the distance between the insulative mask patterns 16 establishes the effective channel length for the gate electrode. Accordingly, the process offers an easy control for providing a desired effective channel length for the gate electrode.

Figure 3A:
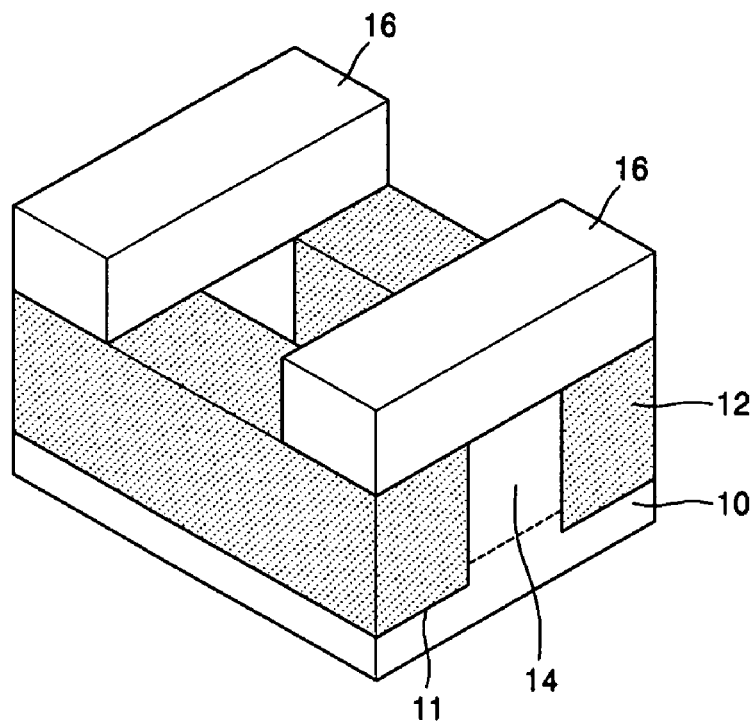
Figure 3B:
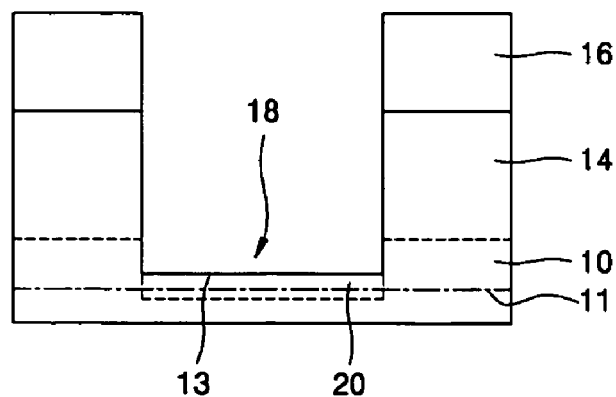

Referring to FIGS. 3A and 3B, the portion of the (wall of the) semiconductor substrate 10 exposed between the insulative mask patterns 16 and the isolation structures 12 is etched using the insulative mask patterns 16 and the isolation structures 12 as etch masks, thereby forming an opening 18 in the semiconductor substrate. The opening 18 terminates at a second lower surface 13 of the semiconductor substrate 10. Although the second lower surface 13 may be situated at any level relative to that of the first lower surface 11, the second lower surface 13 is preferably situated at a level above that of the first lower surface 11 so as to facilitate the exposing of a sacrificial layer, as will be described later on.

In any case, the portions of the wall of the semiconductor substrate 10 separated from each other by the opening 18 comprise a plurality of semiconductor pillars. Each of the pillars has a first ion-implanted area 14 at the upper end thereof.

Subsequently, impurities, such as B, $BF_2$, $BF_3$ or In ions or the like, are implanted into the region of the semiconductor substrate 10 exposed at the bottom of the opening 18, thereby forming a second ion-implanted area 20 in the surface of the semiconductor substrate 10. The impurities of the second ion-implanted area 20 are of the opposite type compared to the impurities of the first ion-implanted area 14, i.e., the region of the semiconductor substrate 10 exposed at the bottom of the opening 18 is counter-doped. Thus, the second ion-implanted area 20 serves as an isolation layer to prevent electrical charges from moving between the semiconductor pillars.

Figure 4A:
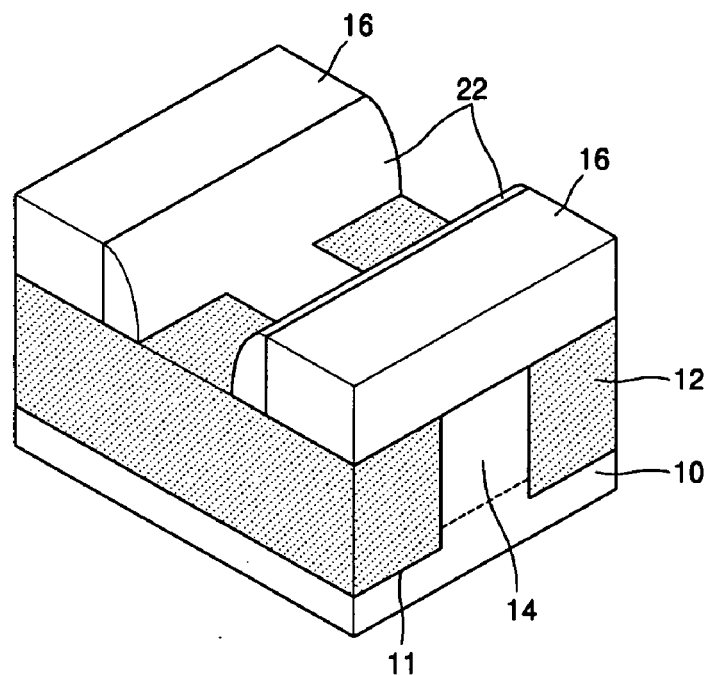
Figure 4B:
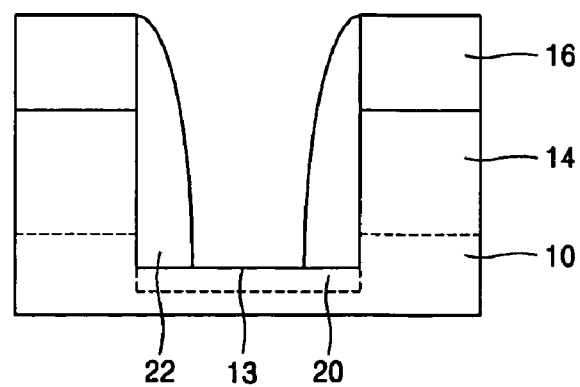

Referring to FIGS. 4A and 4B, first sidewall spacers 22 are formed along inner sides of the structure constituted by the respective confronting sides of the insulative mask patterns 16, the respective confronting sides of the pillars of the semiconductor substrate 10, and the respective confronting sides of isolation structures 12. Although the first insulative spacers 22 may be formed of various insulative materials such as an oxide, a nitride, or the like, the first insulative spacers 22 are preferably formed of an oxide in consideration of the etch selectivity between the semiconductor substrate 10 and the insulative mask patterns 16. Furthermore, it is important that the first insulative spacers 22 each have an accurate thickness, i.e., a thickness that precisely conforms to a design rule, because the thicknesses of the insulative spacers 22 serve to establish the effective channel length of the gate electrode, as will become more clear from the description that follows.

Figure 4C:
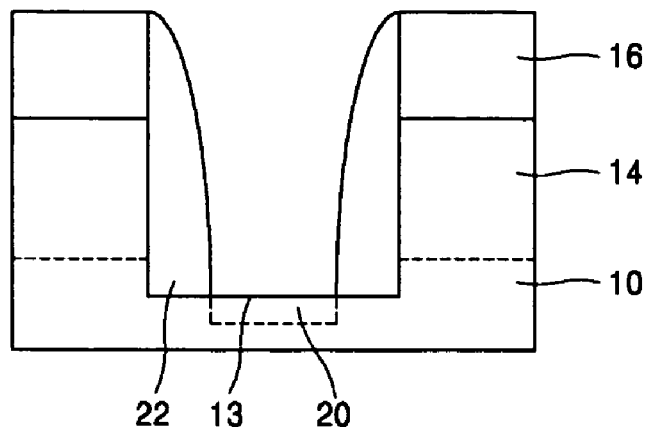
FIG. 4C is a sectional view similar to that of FIG. 4B but showing an alternative way of counter-doping the substrate.
Figure 4D:
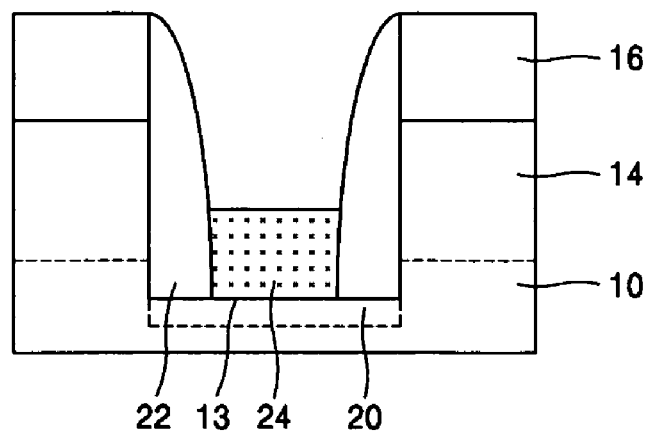
FIG. 4D is a sectional of a GAA type of semiconductor device during the course of its manufacture, illustrating the forming of a sacrificial layer in the first embodiment of a method of manufacturing a GAA type of semiconductor device according to embodiments of the present invention.

However, before that description proceeds, FIG. 4C shows an alternative sequence to the method of the present invention. In particular, FIG. 4C shows that the ion-implanting of the portion of the semiconductor substrate 10 exposed at the bottom of the opening 18 can take place after the first insulative spacers 22 are formed. That is, as an alternative to what is depicted in FIG. 3B, the second ion-implanted area 20 can be formed after the first insulative spacers 22 are formed.

Referring now to FIG. 4C, a sacrificial layer 24 is formed on that portion of the semiconductor substrate 10 exposed between the first insulative spacers 22. The sacrificial layer 24 is not present in the final semiconductor device. Hence, the sacrificial layer 24 may be formed of any of various materials. However, the sacrificial layer 24 is preferably of a material that is excellent in terms of its ability to be formed to a desired thickness, e.g., a material that can be formed by being grown epitaxially. In the present embodiment, the sacrificial layer 24 is preferably an SiGe layer. However, as long as the etch selectivity between the silicon of the semiconductor substrate 10 and the oxide of the first insulative spacers 22 is ensured, the sacrificial layer 24 may instead be formed using chemical vapor deposition, physical vapor deposition, or the like. For example, the sacrificial layer 24 may be formed by chemically vapor-depositing polysilicon on the exposed portion of the semiconductor substrate 10, thermally treating the resultant polysilicon layer, and etching the polysilicon layer.

Figure 5A:
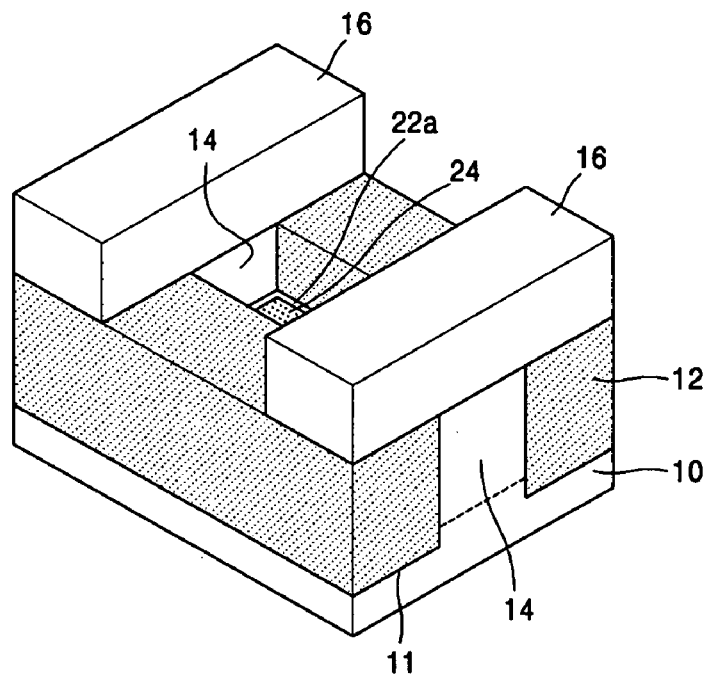
Figure 5B:
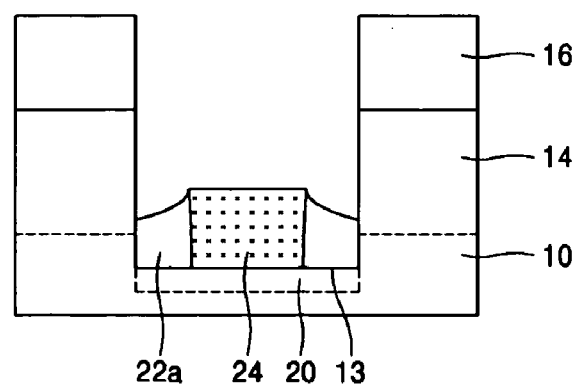

Referring to FIGS. 5A and 5B, the first insulative spacers 22 are etched using the insulative mask patterns 16, the isolation structures 12, and the sacrificial layer 24 as etch masks so that the sacrificial layer 24 and residual portions 22a of the first insulative spacers 22 are left within the opening 18. As is best shown in FIG. 5B, the etching is preferably carried out to such an extent that the upper surfaces of the residual portions 22a are level with or are disposed beneath the level of the upper surface of the sacrificial layer 24. This facilitates a subsequent formation of a channel semiconductor layer and contributes to minimizing the parasitic capacitance between the source/drain and the gate.

Figure 6A:
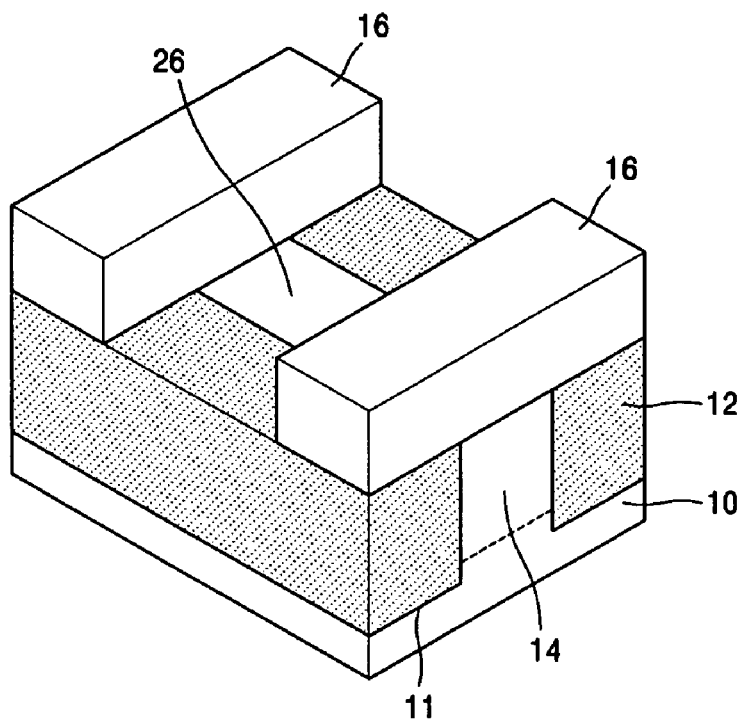
Figure 6B:
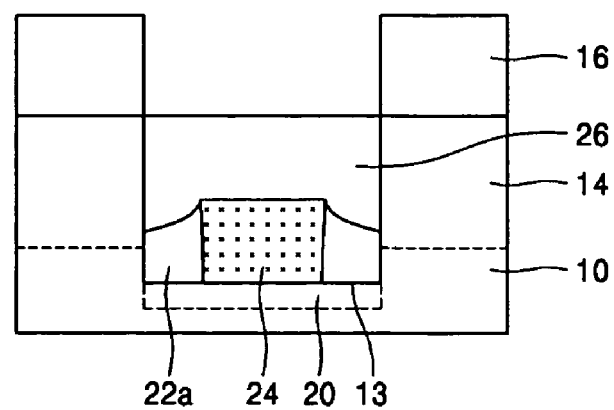
FIG. 6C and 6D are sectional views of a GAA type semiconductor device during the course of manufacture, respectively illustrating a raise channel structure and a recessed channel structure according to embodiments of the present invention.

Referring to FIGS. 6A and 6B, a channel semiconductor layer 26 is formed on the sacrificial layer 24 and the residual portions 22a of the first insulative spacers. The channel semiconductor layer 26 is formed to such a thickness that it fills the opening 18 and thus bridges upper portions of the semiconductor pillars that comprise the first ion-implanted area 14 of the semiconductor substrate 10. Accordingly, the channel semiconductor layer 26 serves as the channel of the transistor. In the present embodiment, the channel semiconductor layer 26 can be an epitaxially grown silicon layer considering the fine coherence that will exist between such a layer and the mono-crystalline silicon semiconductor substrate 10. The epitaxially grown silicon layer may be subjected to a thermal treatment for a predetermined period of time in a hydrogen atmosphere so as to cure defects at the surface thereof. Moreover, the overall thickness of the channel semiconductor layer 26 is dependent on the thickness of the sacrificial layer 24 as measured from the second lower surface 13. Therefore, the sacrificial layer 24 is formed so as to be situated beneath the level of the surface of the semiconductor substrate 10 that contacts the insulative mask patterns 16.

Figure 6C:
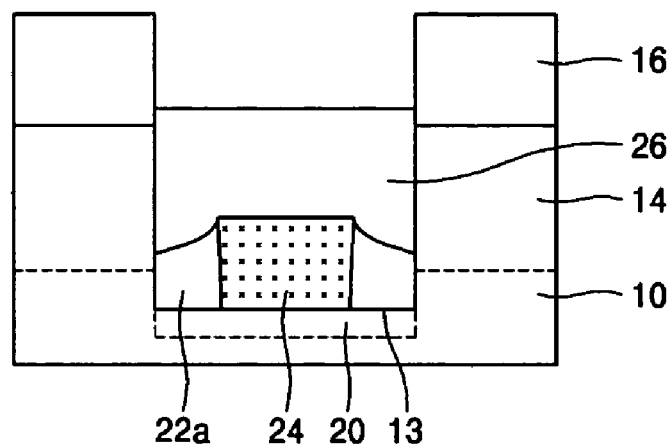
Figure 6D:
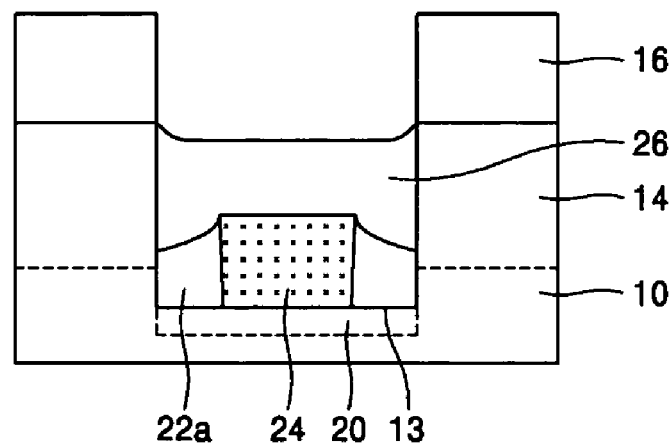

FIG. 6B shows a channel semiconductor layer 26 whose upper surface is level with that of each of the semiconductor pillars. However, a GAA semiconductor device according to the present invention may comprise a raised channel structure, as shown in FIG. 6C. In the raised channel structure, the upper surface of the channel semiconductor layer 26 is situated at a level above that of the upper surfaces of the semiconductor pillars. Alternatively, as shown in FIG. 6D, a GAA semiconductor device according to the present invention may comprise a recessed channel structure in which the upper surface of the channel semiconductor layer 26 is situated at a level below that of the upper surfaces of the semiconductor pillars.

Figure 7A:
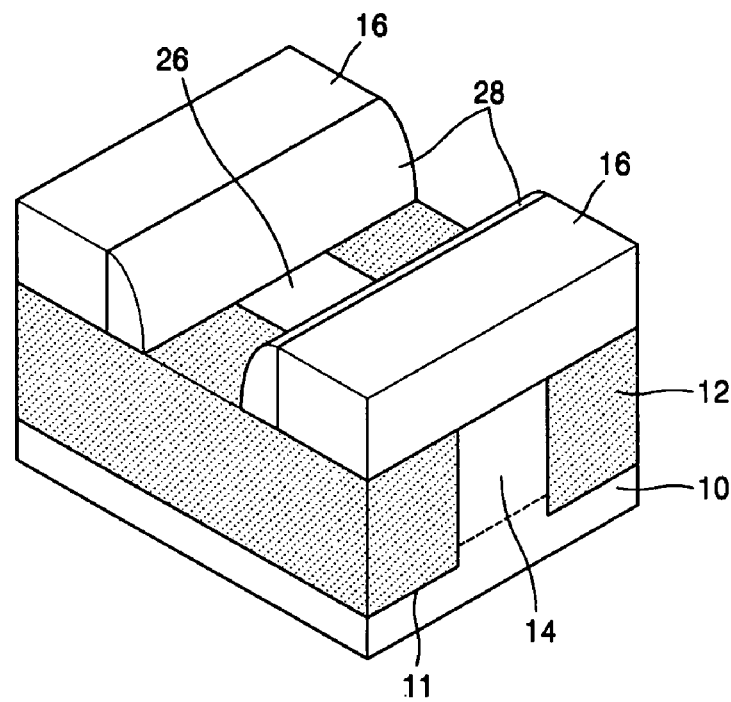
Figure 7B:
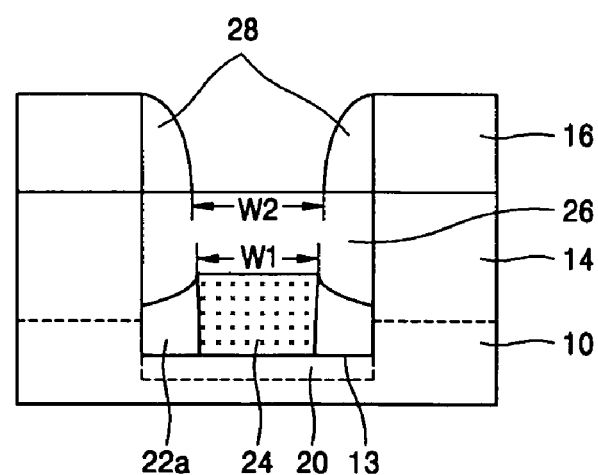

Referring to FIGS. 7A and 7B, insulative material is deposited over the entire surface of the semiconductor substrate 10. Then, the layer of insulative material is anisotropically etched to form second insulative spacers 28 on sidewalls of the insulative mask patterns 16. The second insulative spacers 28 may be formed of an oxide, a nitride, or the like. In any case, the second insulative spacers 28 preferably have an etch selectivity with respect to the isolation structures 12 so that the second insulative spacers 28 will serve as an etch mask in a subsequent etching process.

Furthermore, as was previously described, the thicknesses of the residual portions 22a of the first insulative spacers 22 establish the effective width W1 of a lower portion of the channel. Similarly, the thicknesses of the second insulative spacers 28 and, more specifically, the thicknesses of the bottom portions of the second insulative spacers 28 contacting the channel semiconductor layer 26, establish the effective width W2 of an upper portion of the channel. Hence, the first and second insulative spacers 22 and 28 are preferably formed to nearly the same thickness.

Figure 8A:
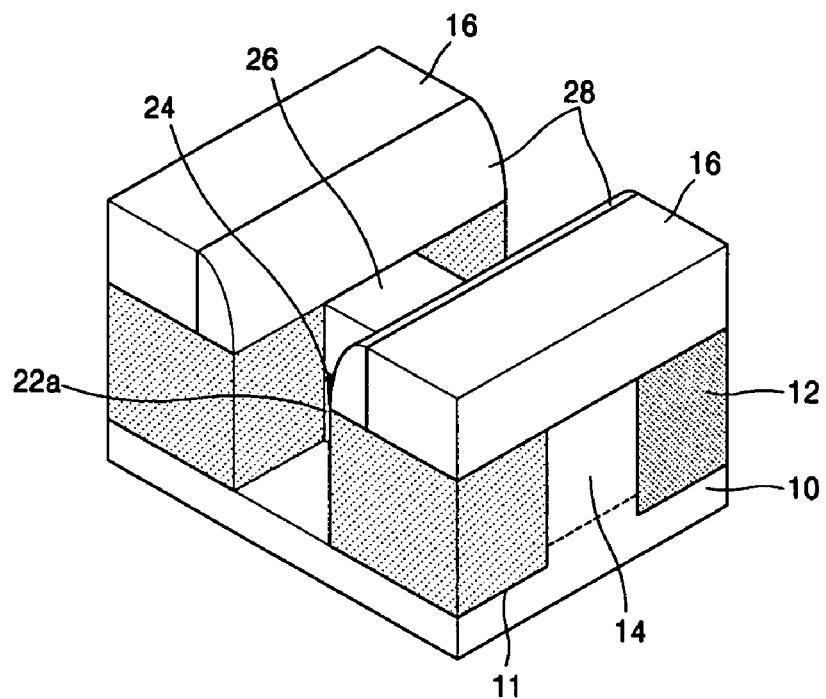
Figure 8B:
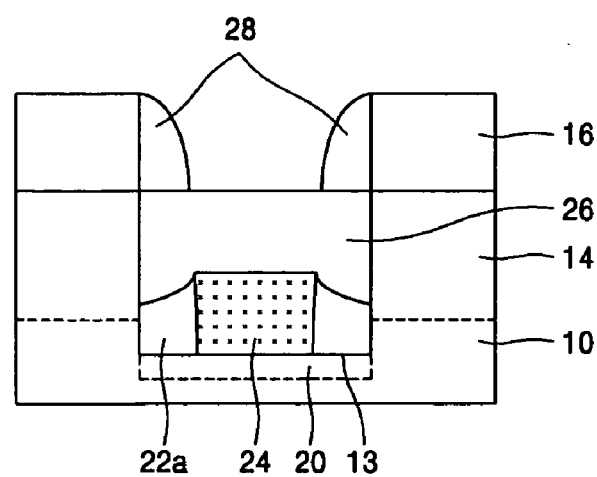

Referring to FIGS. 8A and 8B, the structure is anisotropically etched using the second insulative spacers 28, the insulative mask patterns 16, and the channel semiconductor layer 26 as etch masks. Consequently, the exposed portions of the isolation structures 12, and those parts of the residual portions 22a of the first insulative spacers which extend along sidewalls of the sacrificial layer 24, are removed. Thus, the sidewalls of the sacrificial layer 24 are exposed. When the isolation structures 12 and the first insulative spacers 22 are formed of materials from the same family, for example, an oxide family, the materials have similar etch selectivities. In this case, the exposed portions of the isolation layers 12 and those parts of the residual portions 22a which extend along the sidewalls of the sacrificial layer 24 are removed during a single etching process. Otherwise, the exposed portions of the isolation layers 12, and those parts of the residual portions 22a which extend along the sidewalls of the sacrificial layer 24 are removed separately by two etching processes.

Figure 9A:
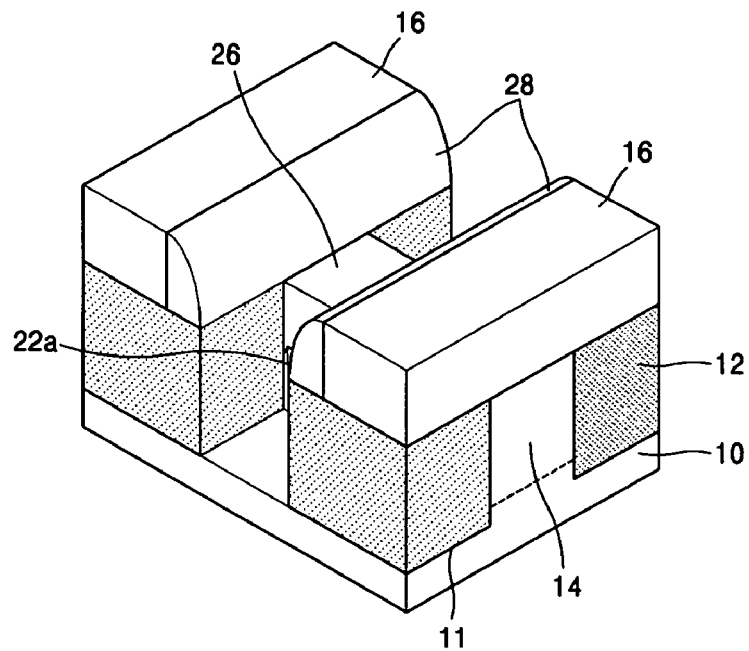
Figure 9B:
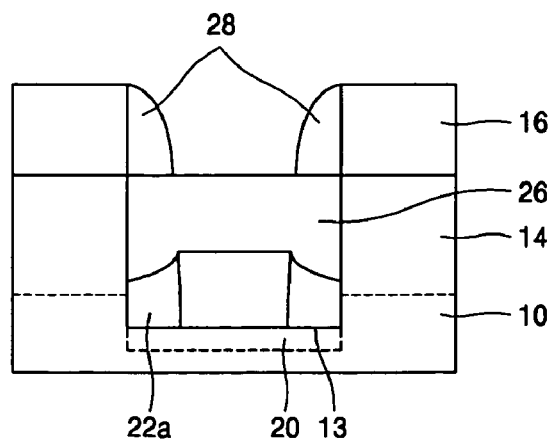

Referring to FIGS. 9A and 9B, next, the remaining sacrificial layer 24 is removed so that a parallelepipedal central portion of the channel semiconductor layer 26 is left completely exposed.

Figure 10A:
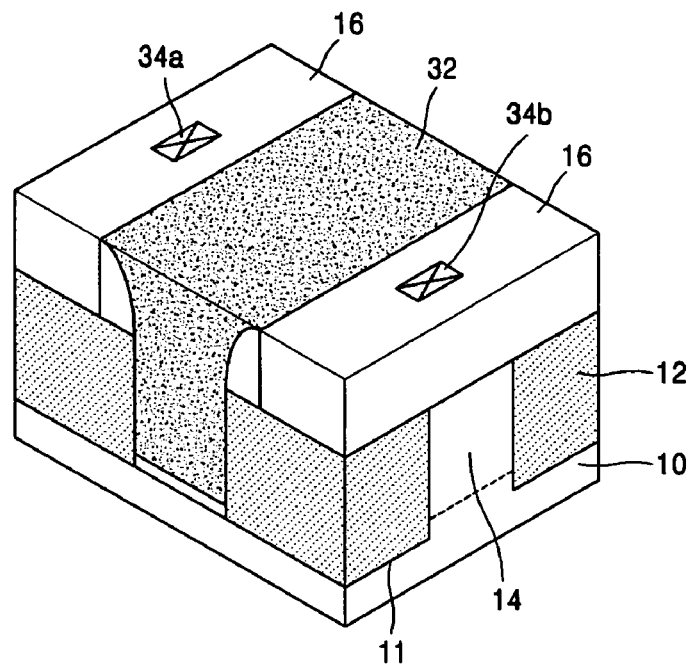
Figure 10B:
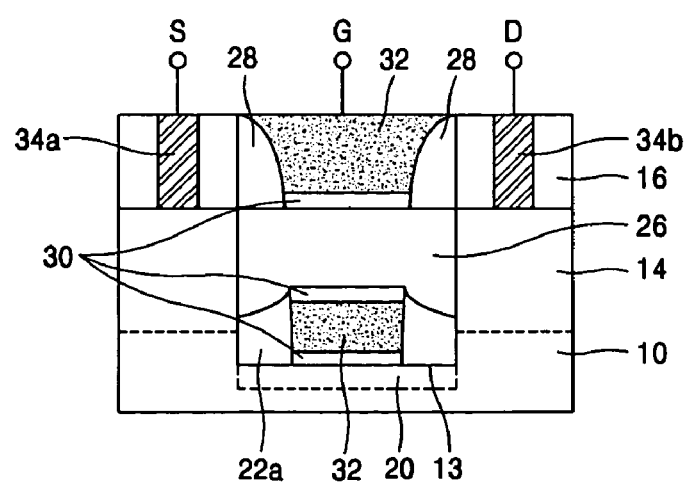
FIG. 10C is a sectional view of a GAA type of semiconductor device having a raised channel structure according to an embodiment of the present invention.
FIG. 10D is a sectional view of a GAA type of semiconductor device having a recessed channel structure according to an embodiment of the present invention.
FIG. 10E is a sectional view of a GAA type of semiconductor device having a channel region whose ends completely overlap the source/drain regions according to an embodiment of the present invention.
FIG. 10F is a sectional view of a GAA type of semiconductor device having a counter-doped region formed according to the technique shown in FIG. 4C according to an embodiment of the present invention.
Figure 10C:
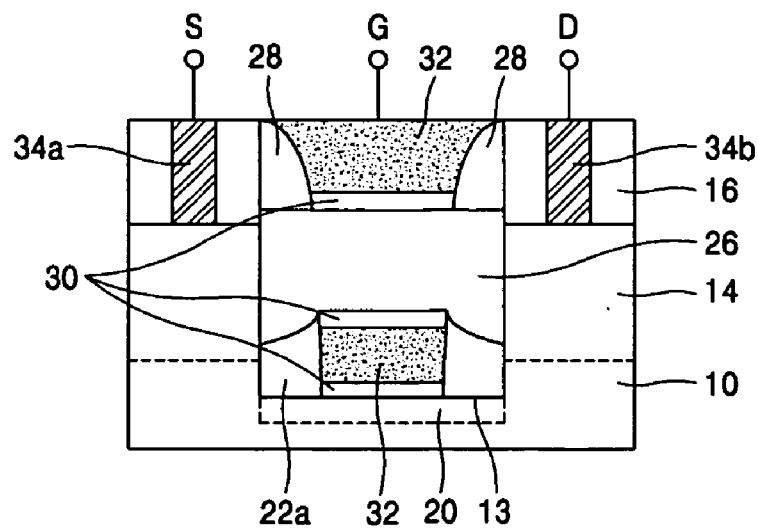

Referring to FIGS. 10A and 10B, a gate insulative layer 30, for example, a silicon oxide layer, is formed on the exposed rectangular surfaces of the channel semiconductor layer 26. A gate insulative layer 30 is also formed on that part of the second lower surface 13 of the semiconductor substrate 10 which was exposed by the removal of the sacrificial layer 24.

Subsequently, gate electrode material, for example, polysilicon, is deposited on the gate insulative layer 30 formed around the channel semiconductor layer 26, thereby forming a gate electrode 32. Preferably, the gate electrode 32 completely fills the area from which the sacrificial layer 24 was removed. The resultant structure may be planarized after the deposition process. Then, a contact hole is formed in each of the insulative mask patterns 16 so as to expose the first ion-implanted area 14. Next, the contact holes are filled with a conductive material to thereby form a source electrode 34a and a drain electrode 34b, whereupon a GAA type of transistor according to the present invention is complete.

Figure 10D:
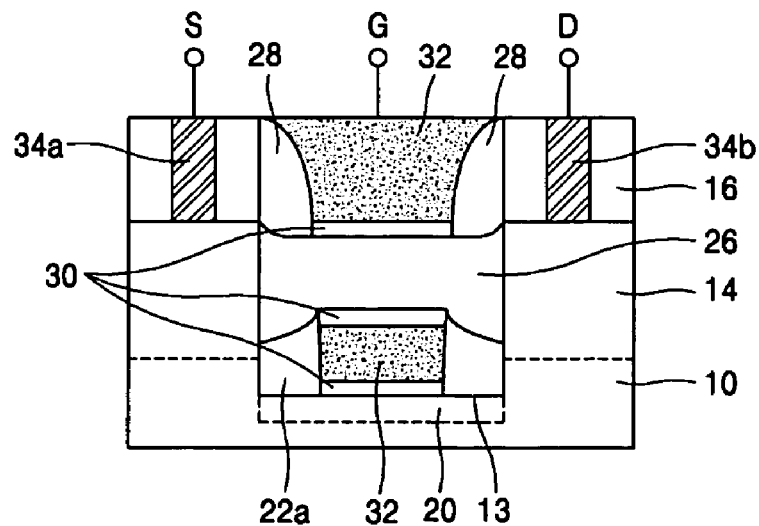
Figure 10E:
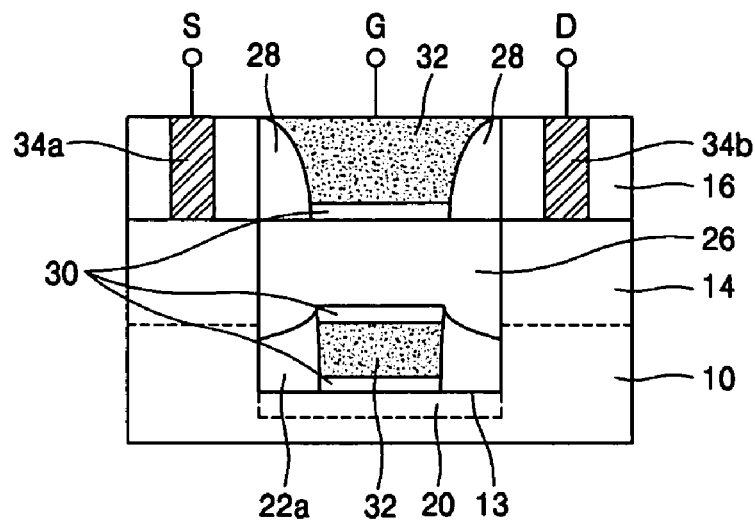
Figure 10F:
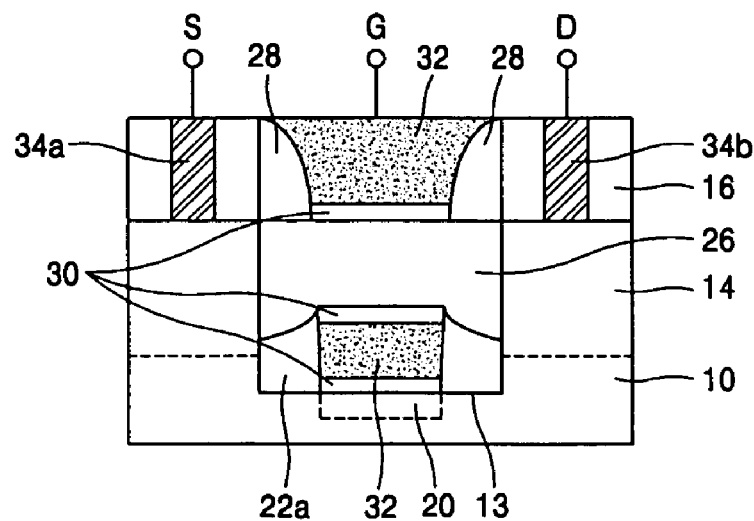

FIGS. 10C–10F show other embodiments of a GAA type of transistor according to the present invention. FIG. 1C shows a GAA type of transistor according to the present invention, wherein the channel semiconductor layer 26 has a raised structure as was described in connection with FIG. 6C. FIG. 10D shows a GAA type of transistor according to the present invention, wherein the channel semiconductor layer 26 has a recessed structure as was described in connection with FIG. 6D. FIG. 10E shows a GAA type of transistor according to the present invention, wherein the first ion-implanted area 14 lies completely within the projection of the rectangular opening extending through the gate electrode 32. That is, the channel region completely overlaps the source/drain regions at the respective ends of the channel region. FIG. 10F shows a GAA type of transistor according to the present invention, wherein the second ion-implanted area 20 is located in the region of the transistor defined between the residual portions 22a of the first insulative spacers, as was described in connection with FIG. 4C.

FIGS. 11A through 18B illustrate another embodiment of a method of manufacturing a GAA semiconductor device according to the present invention.

Figure 11A:
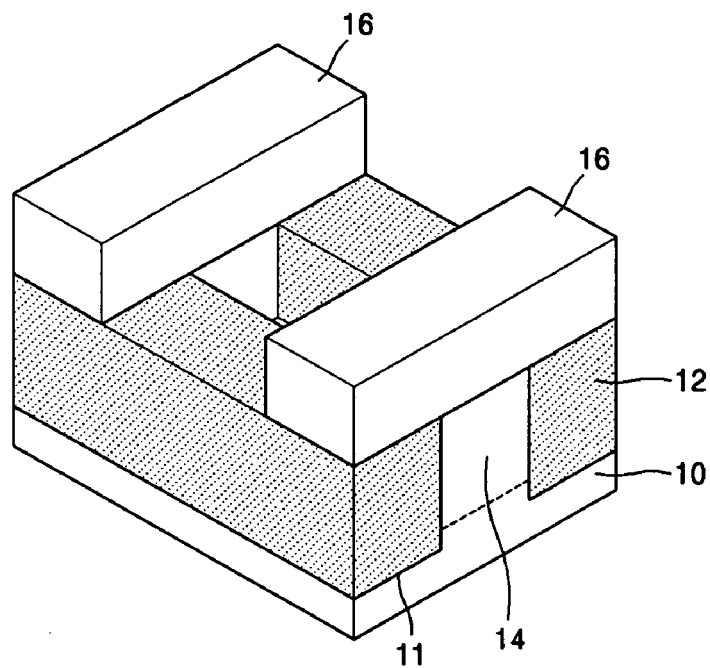
FIGS. 11A, 12A, 13A, 14A, 15A, 16A, 17A, and 18A are perspective views of a GAA type of semiconductor device during the course of its manufacture, illustrating another embodiment of a method of manufacturing a GAA type of semiconductor device according to the present invention.
Figure 11B:
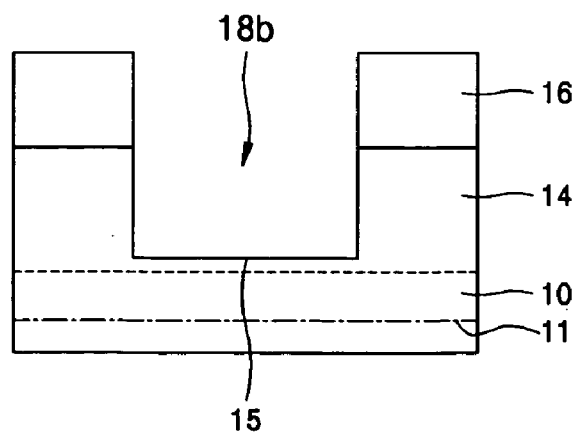
FIGS. 11B, 12B, 13B, 14B, 15B, 16B, 17B, and 18B are sectional views of the device shown in FIGS. 11A, 12A, 13A, 14A, 15A, 16A, 17A, and 18A, respectively.

Referring first to FIGS. 11A and 11B, a wall is formed from a mono-crystalline silicon semiconductor substrate 10. The wall has a predetermined height as measured from a first lower surface 11 of the substrate 10 and extends longitudinally in a first direction. Also, a plurality of isolation structures 12 are formed as extending in the first direction alongside the wall. Subsequently, impurities, such as As, are ion-implanted into the semiconductor substrate 10 so as to form a source/drain region at the surface of the semiconductor substrate 10. The ion-implanted area is thermally treated to stabilize the resultant structure, whereby a first ion-implanted area 14 is formed.

Next, an insulative material layer is formed over the entire surface of the semiconductor substrate 10. Then, the insulative material layer is patterned using photolithography to thereby form a plurality of insulative mask patterns 16 extending in a second direction perpendicular to the first direction in which the wall of the semiconductor substrate 10 extends. In the present embodiment, the insulative mask patterns 16 are formed of SiN. Next, that part of the semiconductor substrate 10 exposed between the insulative mask patterns 16 and the isolation layers 12 is etched using the insulative mask patterns 16 and the isolation layers 12 as etch masks, thereby forming an opening 18b that terminates at a second lower surface 15 situated above the level to which the impurities were implanted in the substrate 10. Upper end portions of the wall of the semiconductor substrate 10 are separated from each other by the opening 18b, thereby forming a plurality of semiconductor pillars. The first ion-implanted area 14 remains on each of the semiconductor pillars.

Figure 12A:
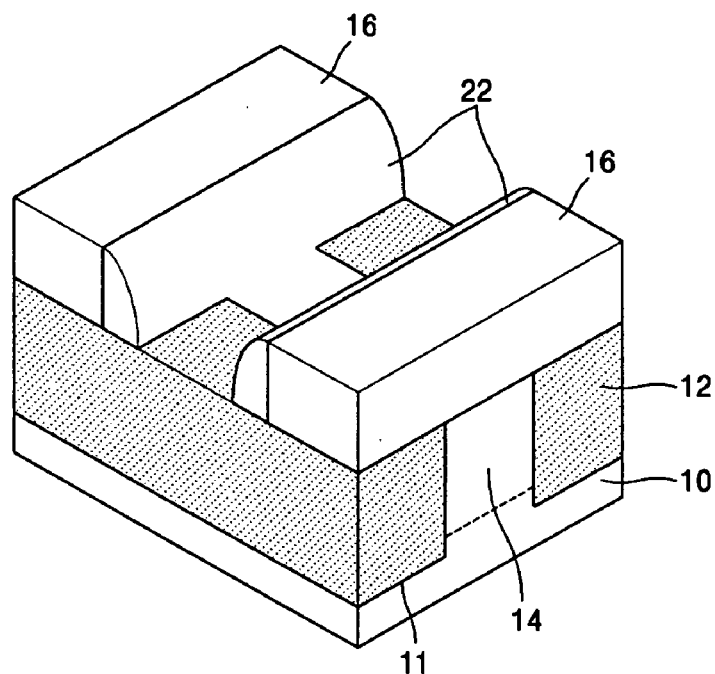
Figure 12B:
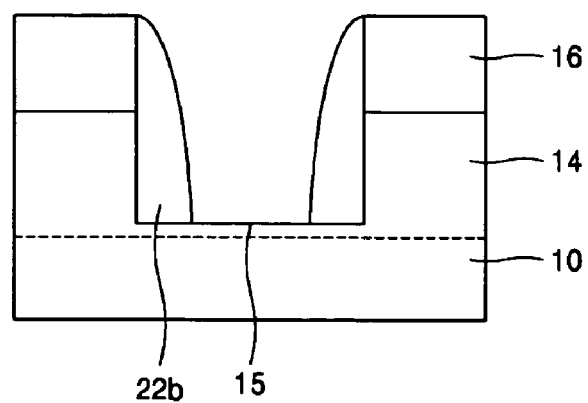

Referring to FIGS. 12A and 12B, insulative material is deposited over the entire surface of the semiconductor substrate 10 in which the opening 18b was formed. Subsequently, the layer of insulative material is anisotropically etched to form first insulative spacers 22b which cover the sides of the opening 18b and the confronting sidewalls of the insulative mask patterns 16.

Figure 12C:
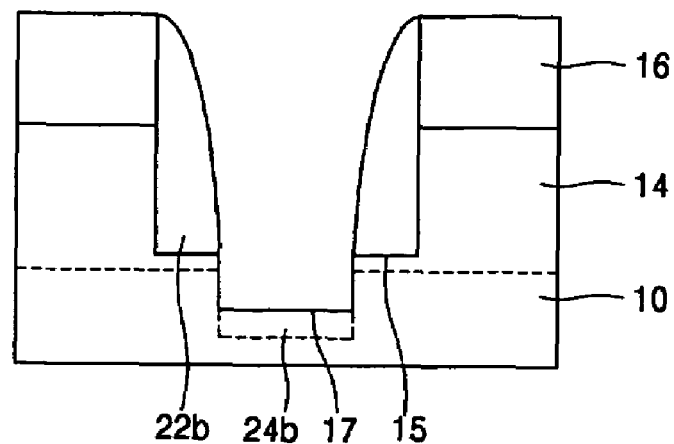
FIG. 12C is a sectional view similar to that of FIG. 12B, illustrating the counter-doping of the substrate.

Referring to FIG. 12C, the portion of semiconductor substrate 10 exposed at the bottom of the opening 18b is etched a predetermined amount using the first insulative spacer 22b as etch masks. The etching process forms a recess whose bottom is defined by a third lower surface 17 of the substrate. Next, impurities, such as B, $BF_2$ or In ions, or the like, are implanted into the semiconductor substrate 10, thereby counter-doping the substrate 10 and forming a second ion-implanted area 20b in the third lower surface 17 of the semiconductor substrate 10. The second ion-implanted area 20 serves as an isolation layer to prevent electrical charges from moving between the semiconductor pillars. Although the third lower surface 17 may be situated at any level relative to that of the first lower surface 11, the third lower surface 17 is preferably situated at a level above that of the first lower surface 11 so as to facilitate the exposure of a sacrificial layer, as will be described later on.

Figure 12D:
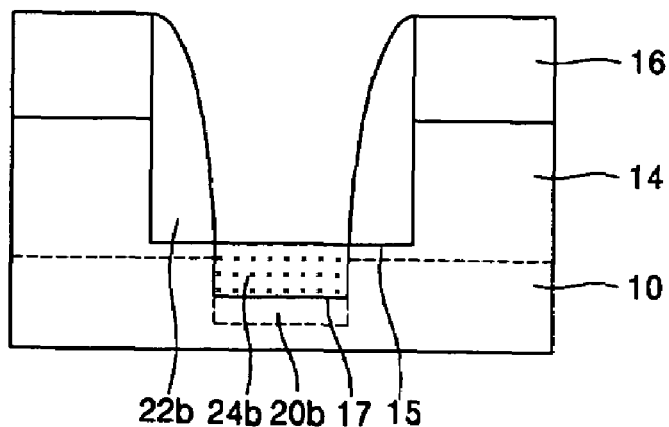
FIG. 12D is a sectional view similar to that of FIG. 12B, illustrating the forming of the sacrificial layer.

Referring to FIG. 12D, a sacrificial layer 24b is formed on that portion of the semiconductor substrate 10 exposed between the first insulative spacers 22b. Preferably, the sacrificial layer 24b fills the recessed portion of the semiconductor substrate 10 and has a flat upper surface level with the second lower surface 15 of the substrate 10. To this end, the sacrificial layer 24b is preferably of a material that is excellent in terms of its ability to be formed to a desired thickness, e.g., a material that can be formed by being grown epitaxially. In the present embodiment, the sacrificial layer 24 is preferably an SiGe layer. However, as long as the etch selectivity between the silicon of the semiconductor substrate 10 and the oxide of the first insulative spacers 22b is ensured, the sacrificial layer 24b may instead be formed using chemical vapor deposition, physical vapor deposition, or the like. For example, the sacrificial layer 24b may be formed by chemically vapor-depositing polysilicon on the exposed portion of the semiconductor substrate 10, thermally treating the resultant polysilicon layer, and etching the polysilicon layer.

Figure 13A:
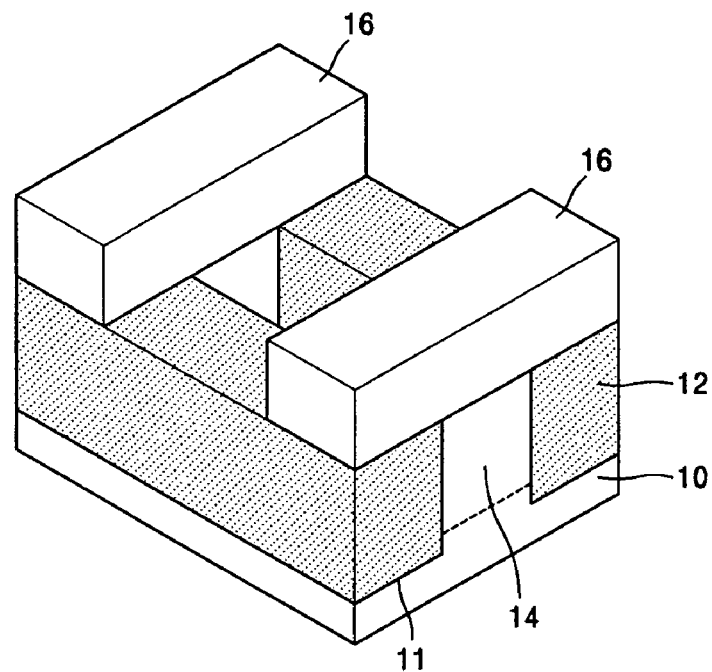
Figure 13B:
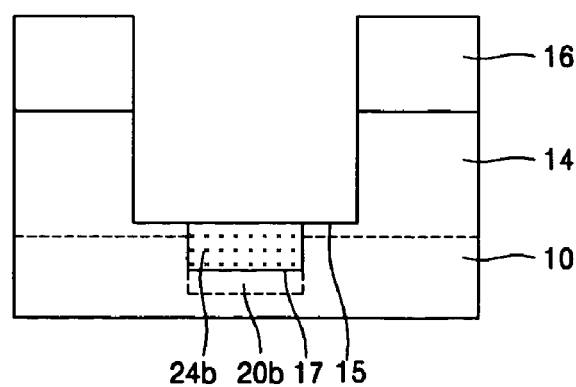

Referring to FIGS. 13A and 13B, the first insulative spacers 22b are completely etched away using the insulative mask patterns 16, the isolation layers 12, the semiconductor substrate 10, and the sacrificial layer 24b as etch masks. Therefore, the sacrificial layer 24b is exposed below the second lower surface 15 of the substrate 10 at the bottom of the central portion of the opening 18b.

Figure 14A:
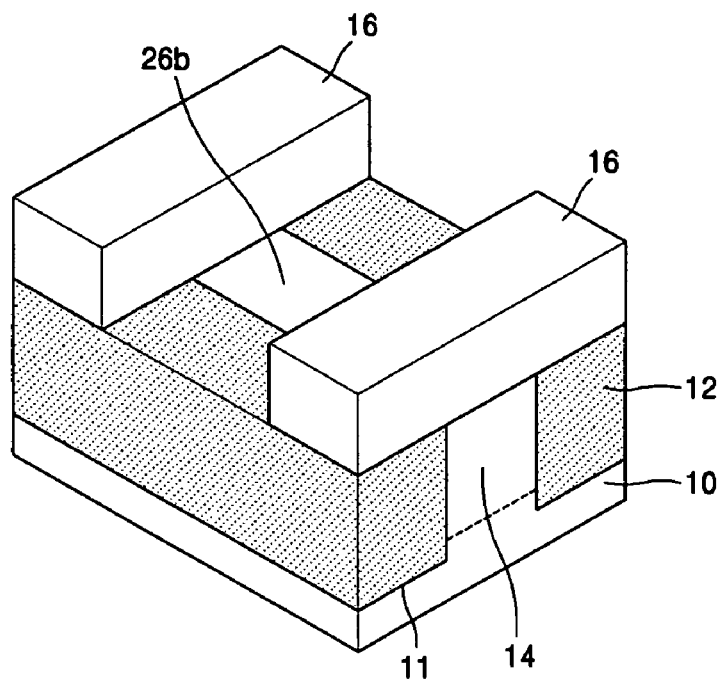
Figure 14B:
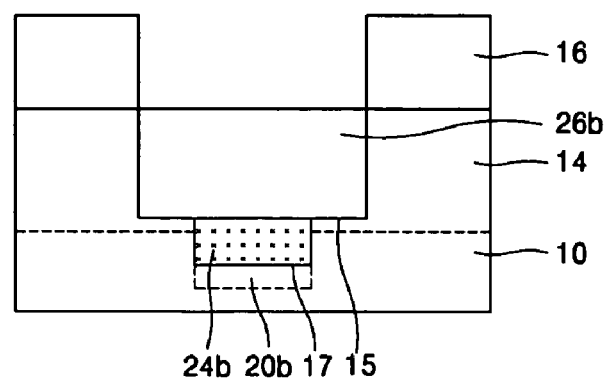
Figure 14C:
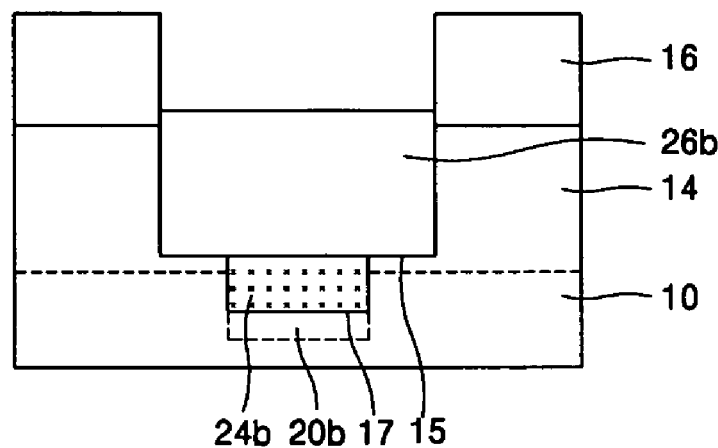
FIG. 14C is a sectional view similar to that of FIG. 14B, but illustrating the forming of a raised channel structure according to an embodiment of the present invention.
Figure 14D:
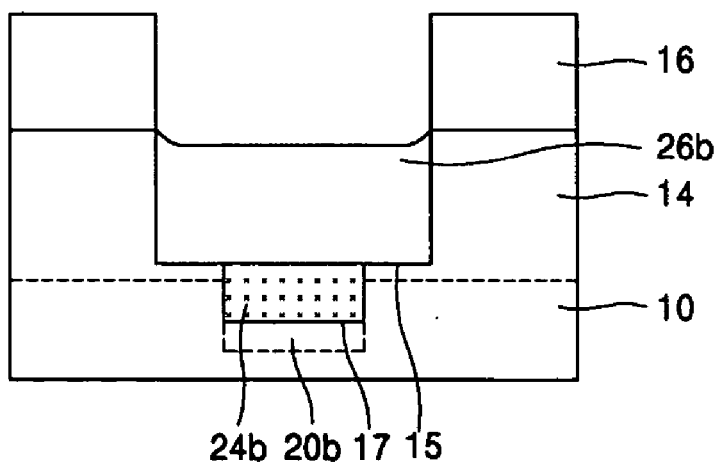
FIG. 14D is a sectional view similar to that of FIG. 14B, but illustrating the forming of a recessed channel structure according to an embodiment of the present invention.

Referring to FIGS. 14A and 14B, a channel semiconductor layer 26b is formed on the sacrificial layer 24b. The channel semiconductor layer 26b completely fills the opening 18b so as to bridge and thereby connect the semiconductor pillars. More specifically, the channel semiconductor layer 26b extends between those portions of the first ion-implanted area 14 formed on the semiconductor pillars, respectively. Thus, the channel semiconductor layer 26b serves as the channel of the transistor. In the present embodiment, the channel semiconductor layer 26b can be an epitaxially grown silicon layer considering the fine coherence that will exist between such a layer and the monocrystalline silicon semiconductor substrate 10. The epitaxially grown silicon layer may be subjected to a thermal treatment for a predetermined period of time in a hydrogen atmosphere so as to cure defects at the surface thereof. Moreover, the overall thickness of the channel semiconductor layer 26b is such that its upper surface is situated at substantially the same level with those of the semiconductor pillars. However, as shown in FIG. 14C, the semiconductor layer 26b may have a raised structure wherein the upper surface thereof is situated above the level of the upper surfaces of the semiconductor pillars. Alternatively, as shown in FIG. 14D, the semiconductor layer 26b may have a recessed structure wherein the upper surface thereof is situated below the level of the upper surfaces of the semiconductor pillars.

Figure 15A:
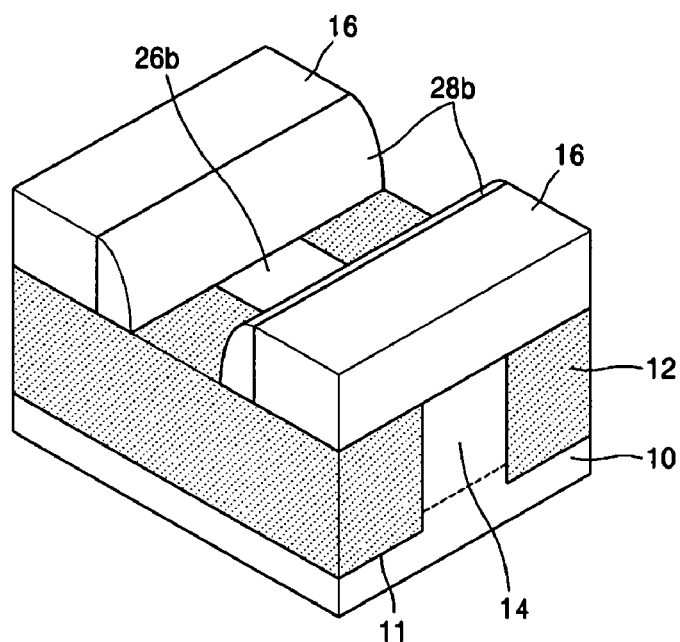
Figure 15B:
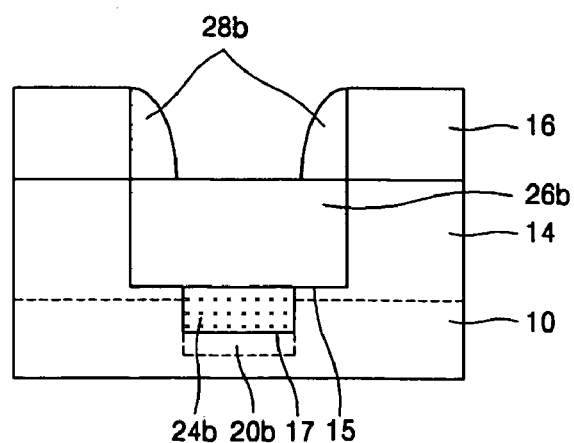

Referring to FIGS. 15A and 15B, insulative material is again deposited over the entire surface of the semiconductor substrate 10. This layer of insulative material is anisotropically etched to thereby form second insulative spacers 28b on sidewalls of the insulative mask patterns 16. The second insulative spacers 28b may be formed of an oxide, a nitride, or the like. In any case, the second insulative spacers 28b preferably have an etch selectivity with respect to the isolation structures 12 so that the second insulative spacers 28b will serve as an etch mask in a subsequent etching process.

Furthermore, the thicknesses of the bottom portions of the first insulative spacers 22b establish the effective width of a lower portion of the channel. Similarly, the thicknesses of the second insulative spacers 28b and, more specifically, the thicknesses of the bottom portions of the second insulative spacers 28 contacting the channel semiconductor layer 26b, establish the effective width of an upper portion of the channel. Hence, the first and second insulative spacers 22b and 28b are preferably formed to nearly the same thickness.

Figure 16A:
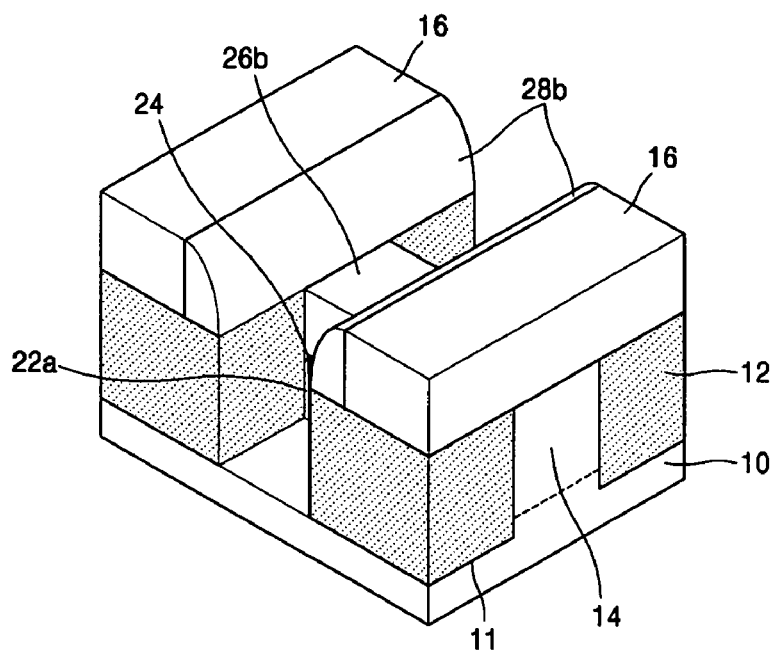
Figure 16B:
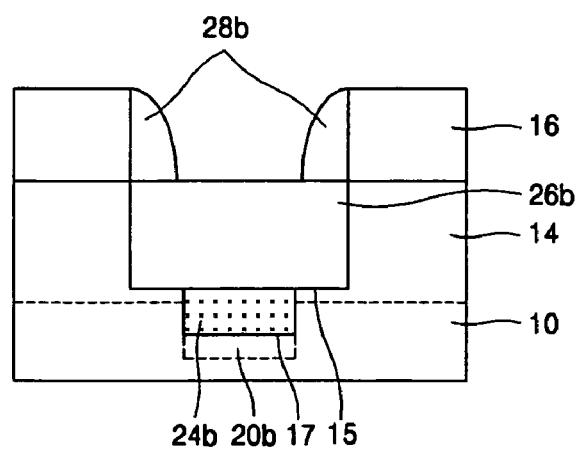

Referring to FIGS. 16A and 16B, the structure is anisotropically etched using the second insulative spacers 28b, the insulative mask patterns 16, and the channel semiconductor layer 26b as etch masks. Consequently, the exposed portions of the isolation layers 12 are removed so as to expose the sidewalls of the sacrificial layer 24b.

Figure 17A:
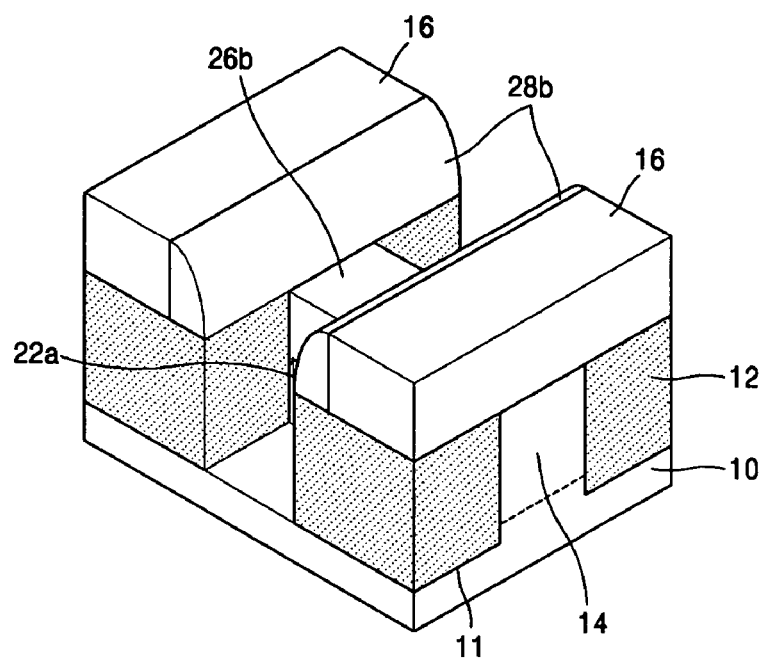
Figure 17B:
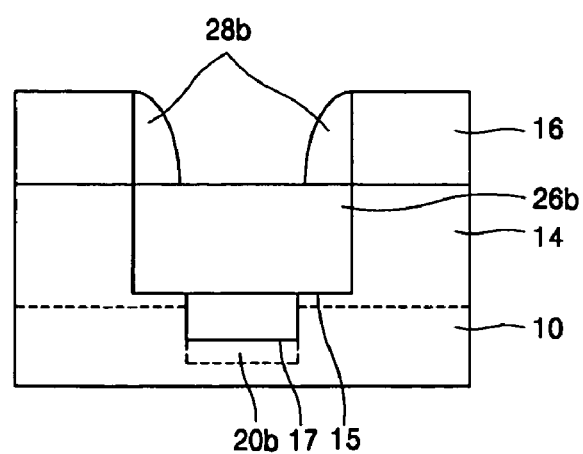

Referring to FIGS. 17A and 17B, the sacrificial layer 24b is removed so that a central portion of the channel semiconductor layer 26b is exposed.

Figure 18A:
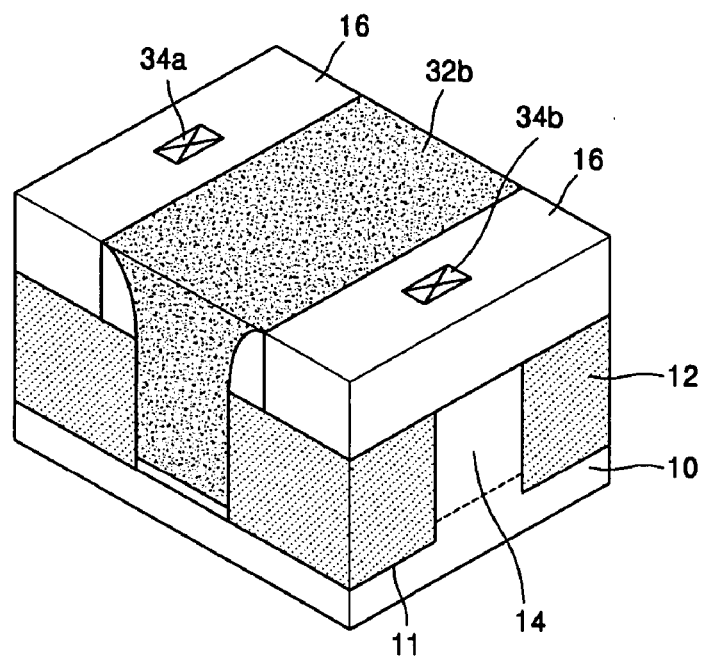
Figure 18B:
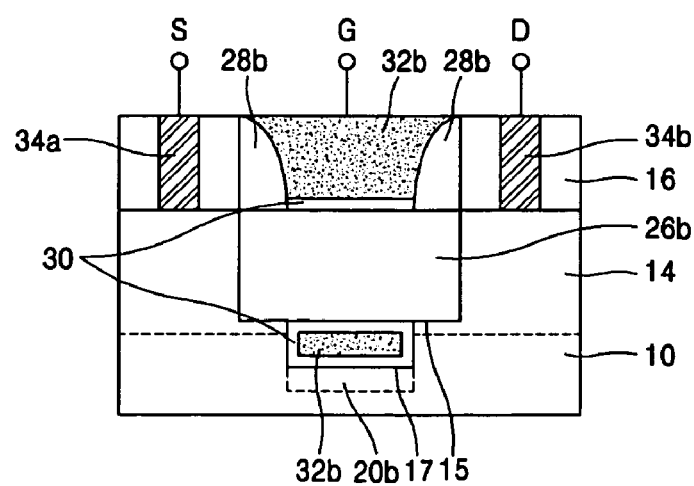

Referring to FIGS. 18A and 18B, a gate insulative layer 30, for example, a silicon oxide layer, is formed on the exposed surfaces of the channel semiconductor layer 26b. A gate insulative layer 30 is also formed on surfaces of the semiconductor substrate 10 that are exposed by the removal of the sacrificial layer 24b.

Subsequently, gate electrode material, for example, polysilicon, is deposited on the gate insulative layers 30, thereby forming a gate electrode 32b. Preferably, the gate electrode 32b completely fills the area from which the sacrificial layer 24b was removed. The resultant structure may be planarized after the deposition process. Then, a contact hole is formed in each of the insulative mask patterns 16 so as to expose the first ion-implanted area 14. Next, the contact holes are filled with a conductive material to thereby form a source electrode 34a and a drain electrode 34b, whereupon a GAA type of transistor according to the present invention is complete.

Figure 18C:
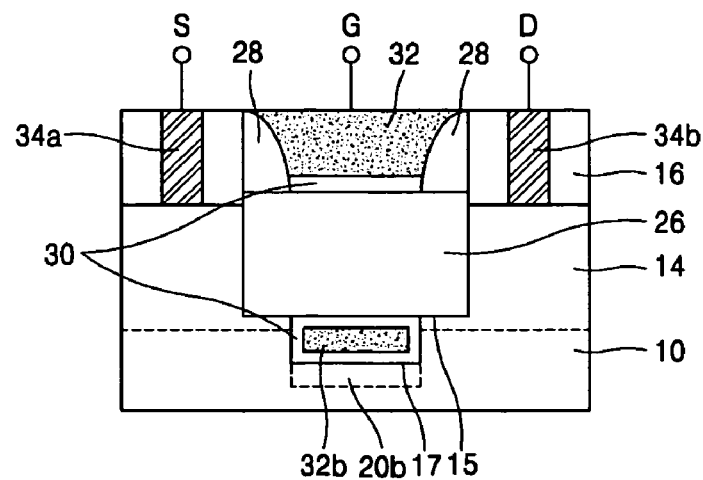
FIG. 18C is a sectional view of another embodiment of a GAA type of semiconductor device having a raised channel structure according to an embodiment of the present invention.
Figure 18D:
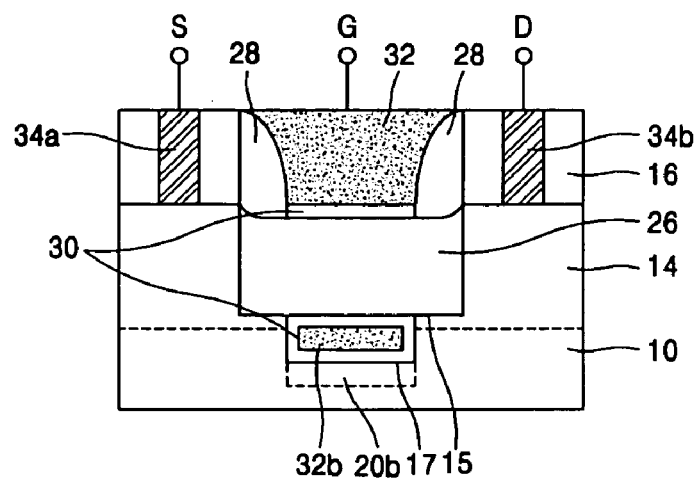
FIG. 18D is a sectional view of another embodiment of a GAA type of semiconductor device having a recessed channel structure according to the present invention.
Figure 18E:
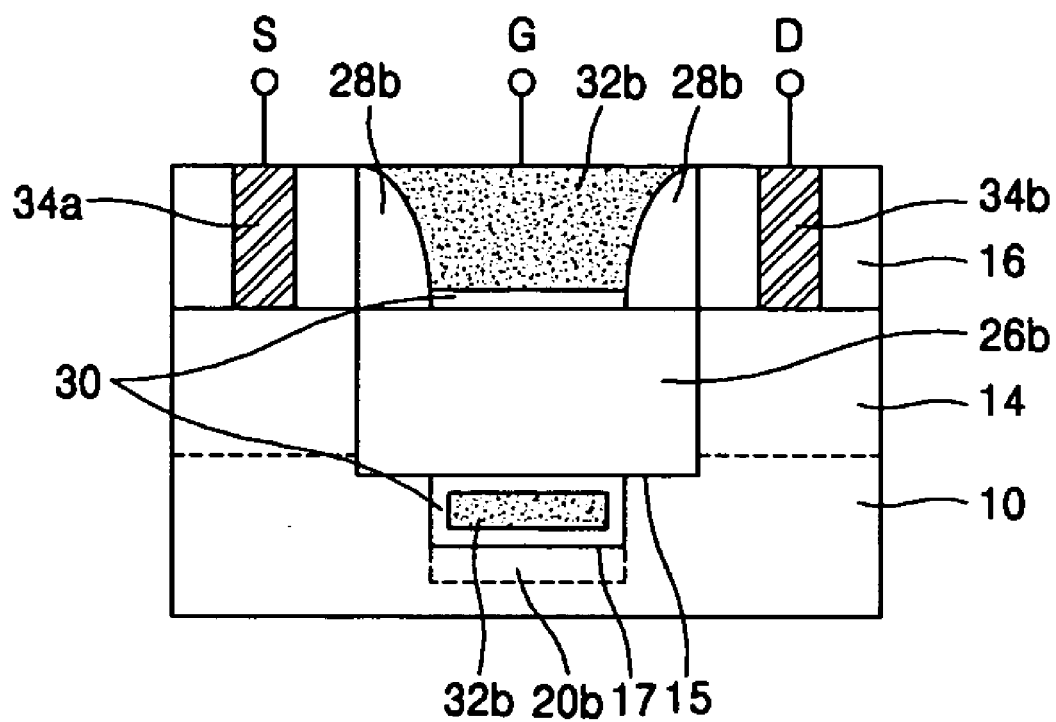
FIG. 18E is a sectional view of another embodiment of a GAA type of semiconductor device having a channel region whose ends completely overlap the source/drain regions according to the present invention.

FIGS. 18C–18E show other embodiments of a GAA type of transistor according to the present invention. FIG. 18C shows a GAA type of transistor according to the present invention, wherein the channel semiconductor layer 26 has a raised structure as was described in connection with FIG. 14C. FIG. 18D shows a GAA type of transistor according to the present invention, wherein the channel semiconductor layer 26 has a recessed structure as was described in connection with FIG. 14D. FIG. 18E shows a GAA type of transistor according to the present invention, wherein the first ion-implanted area 14 lies completely within the projection of the rectangular opening extending through the gate electrode 32b. That is, the channel region completely overlaps the source/drain regions at the respective ends of the channel region.

Finally, although the present invention has been particularly shown and described with reference to the preferred embodiments thereof, it will be understood by those of ordinary skill in the art that various changes in form and details may be made thereto without departing from the true spirit and scope of the present invention as defined by the following claims.

What is claimed is:

1. A method of fabricating a gate-all-around (GAA) transistor device, comprising:
   providing a substrate having an active region in the form of a strip extending lengthwise in a first direction between first and second isolation regions;
   forming an opening in the active region between the first and second isolation regions;
   forming sidewall spacers within the opening on opposing sidewalls of the active region;
   forming a sacrificial layer at the bottom of the opening between the sidewall spacers;
   removing upper portions of the sidewall spacers to expose at least upper portions of the opposing sidewalls of the active region, while leaving residual portions of the sidewall spacers at the bottom of said opening;
   forming a channel region between the exposed portions of the opposing sidewalls of the active layer and over the sacrificial layer and the residual portions of the sidewall spacers;
   subsequently removing the sacrificial layer; and
   subsequently forming a gate insulating layer and a gate electrode within the opening around the channel region.

2. The method of claim 1, wherein said forming an opening in the active region comprises forming mask patterns extending across the active region and spaced apart from one another in said first direction so as to have opposing sidewalls, and etching the active region using the mask patterns as an etch mask, and further comprising forming second sidewall spacers on the opposing sidewalls of the mask patterns and across the channel region prior to forming the gate oxide layer and gate electrode.

3. The method of claim 1, wherein said forming of the sacrificial layer comprises epitaxially growing SiGe at the bottom of the opening between the sidewall spacers.

4. The method of claim 1, wherein said forming a channel region between the exposed portions of the opposing sidewalls of the active layer comprises epitaxially growing Si over the sacrificial layer and the residual portions of the sidewall spacers.

5. The method of claim 1, wherein said providing a substrate having an active region in the form of a strip comprises providing a mono-crystalline silicon substrate, etching said substrate to form a pair of spaced-apart trenches therein extending in said first direction, whereby a wall of the mono-crystalline silicon stands between the trenches, filling the trenches with insulative material to form trench isolation structures, and implanting impurities into the wall of mono-crystalline silicon.

6. The method of claim 5, wherein said forming an opening in the active region comprises forming mask patterns extending across said wall and spaced apart from one another in said first direction so as to have opposing sidewalls, and etching the wall using the mask patterns as an etch mask.

7. The method of claim 6, wherein the etching of the wall using the mask patterns as an etch mask is controlled such that the bottom of said opening is situated at a level above the bottom of each of said trenches.

8. The method of claim 6, and further comprising forming second sidewall spacers on the opposing sidewalls of the mask patterns and across the channel region prior to forming the gate oxide layer and gate electrode.

9. The method of claim 8, wherein the second sidewall spacers are formed so as to also extend across the isolation structures, and said removing the sacrificial layer comprises etching away portions of the isolation structures exposed between said second sidewall spacers, and subsequently etching away the sacrificial layer.

10. The method of claim 1, and further comprising implanting impurities into the entire region of the substrate exposed at the bottom of said opening before the sidewall spacers are formed.

11. The method of claim 1, and further comprising implanting impurities into the entire region of the substrate exposed at the bottom of said opening after the sidewall spacers are formed.

12. A method of fabricating a gate-all-around (GAA) transistor device, comprising:
   providing a substrate having an active region in the form of a strip extending lengthwise in a first direction between first and second isolation regions;
   forming an opening in the active region between the first and second isolation regions;
   forming sidewall spacers within the opening on opposing sidewalls of the active region;
   subsequently forming a recess in the substrate between the sidewall spacers;
   forming a sacrificial layer in the recess;
   removing the sidewall spacers to expose the opposing sidewalls of the active region;
   forming a channel region between the exposed opposite sidewalls of the active layer and over the sacrificial layer;
   removing the sacrificial layer;
   forming a gate insulating layer and gate electrode which surround the bridge channel region.

13. The method of claim 12, wherein said forming an opening in the active region comprises forming mask patterns extending across the active region and spaced apart from one another in said first direction so as to have opposing sidewalls, and etching the active region using the mask patterns as an etch mask.

14. The method of claim 12, wherein said forming of the sacrificial layer comprises epitaxially growing SiGe in said recess.

15. The method of claim 12, wherein said forming a channel region between the exposed portions of the opposing sidewalls of the active layer comprises epitaxially growing Si over the sacrificial layer.

16. The method of claim 12, wherein said providing a substrate having an active region in the form of a strip comprises providing a mono-crystalline silicon substrate, etching said substrate to form a pair of spaced-apart trenches therein extending in said first direction, whereby a wall of the mono-crystalline silicon stands between the trenches, filling the trenches with insulative material to form trench isolation structures, and implanting impurities into the wall of mono-crystalline silicon.

17. The method of claim 16, wherein said forming an opening in the active region comprises forming mask patterns extending across said wall and spaced apart from one another in said first direction so as to have opposing sidewalls, and etching the wall using the mask patterns as an etch mask.

18. The method of claim 17, wherein the etching of the wall using the mask patterns as an etch mask is controlled such that the bottom of said opening is situated at a level above the bottom of each of said trenches.

19. The method of claim 17, and further comprising forming second sidewall spacers on the opposing sidewalls of the mask patterns and across the channel region prior to forming the gate oxide layer and gate electrode.

20. The method of claim 19, wherein the second sidewall spacers are formed so as to also extend across the isolation structures along opposing sidewalls of said mask patterns, respectively, and said removing the sacrificial layer comprises etching away portions of the isolation structures exposed between said second sidewall spacers, and subsequently etching away the sacrificial layer.

21. The method of claim 12, further comprising implanting impurities into the entire region of the substrate exposed at the bottom of said opening after the sidewall spacers are formed.

22. A method of manufacturing a gate-all-around (GAA) transistor device, comprising:

providing a silicon substrate;

etching the substrate to form a pair of spaced-apart trenches such that a wall of the silicon is left standing between the trenches;

filling the trenches with insulative material;

ion-implanting impurities into the substrate;

subsequently forming an opening in the wall to separate portions of the wall, thereby forming spaced-apart pillars of silicon implanted with the impurities, regions of the pillars implanted with the impurities constituting source and drain regions, respectively;

forming a channel region in the opening as bridging the source and drain regions; and forming a gate oxide and gate electrode around the channel region.

23. The method of claim 22, wherein said forming an opening in the wall comprises forming mask patterns extending across the wall and spaced apart from one another in the longitudinal direction of the wall so as to have opposing sidewalls, and etching the active region using the mask patterns as an etch mask.

24. The method of claim 22, further comprising implanting impurities in the substrate at the bottom of said opening.

25. The method of claim 22, and further comprising forming a sacrificial layer at the bottom of said opening before the channel region is formed, and removing the sacrificial layer after the channel region is formed and before the gate oxide and gate electrode are formed.

* * * * *